United States Patent
Hong et al.

(10) Patent No.: US 9,789,466 B2
(45) Date of Patent: Oct. 17, 2017

(54) COMPOSITION FOR PACKAGING ELECTRONIC DEVICE, PACKAGING METHOD, AND OLED DISPLAY APPARATUS

(71) Applicant: BOE TECHNOLOGY GROUP CO., LTD., Beijing (CN)

(72) Inventors: Rui Hong, Beijing (CN); Dan Wang, Beijing (CN); Seiji Fujino, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 37 days.

(21) Appl. No.: 14/762,050

(22) PCT Filed: Oct. 17, 2014

(86) PCT No.: PCT/CN2014/088788
§ 371 (c)(1),
(2) Date: Jul. 20, 2015

(87) PCT Pub. No.: WO2016/008222
PCT Pub. Date: Jan. 21, 2016

(65) Prior Publication Data
US 2016/0296907 A1    Oct. 13, 2016

(30) Foreign Application Priority Data

Jul. 14, 2014  (CN) .......................... 2014 1 0334114

(51) Int. Cl.
*H01L 21/00*     (2006.01)
*B01J 20/16*     (2006.01)
(Continued)

(52) U.S. Cl.
CPC ............. *B01J 20/165* (2013.01); *B01J 20/06* (2013.01); *B01J 20/10* (2013.01); *C03C 3/21* (2013.01);
(Continued)

(58) Field of Classification Search
CPC ..... H01L 51/5246; B01J 20/165; B01J 20/10; B01J 20/06; C03C 3/21; C03C 8/08; C03C 8/24
See application file for complete search history.

(56) References Cited

U.S. PATENT DOCUMENTS 4,671,889 A    6/1987  Schreiner et al.
6,589,625 B1 * 7/2003  Kothari ................. B81B 7/0041
                                                          428/192
(Continued)

FOREIGN PATENT DOCUMENTS

CN    1618134 A    5/2005
CN    1703123 A    11/2005
(Continued)

OTHER PUBLICATIONS

International Search Report Appln. No. PCT/CN2014/088788; Dated Apr. 8, 2015.
(Continued)

*Primary Examiner* — Victor A Mandala
*Assistant Examiner* — Colleen E Snow
(74) *Attorney, Agent, or Firm* — Ladas & Parry LLP

(57) ABSTRACT

A composition for packaging an electronic device comprises a matrix and an adsorption material having a water vapor adsorption capability, and the adsorption material includes attapulgite and/or zeolite. By adding attapulgite and/or zeolite which have an adsorption effect to modify the formulation of the frit, the compositions for packaging an electronic device can effectively reduce the influence of water vapor on the electronic device, thereby effectively extending the lifetime of the packaged electronic device.

20 Claims, 1 Drawing Sheet

(51) Int. Cl.
- *H01L 51/52* (2006.01)
- *C03C 3/21* (2006.01)
- *C03C 8/08* (2006.01)
- *C03C 8/24* (2006.01)
- *B01J 20/06* (2006.01)
- *B01J 20/10* (2006.01)
- *H01L 51/56* (2006.01)

(52) U.S. Cl.
CPC .................. *C03C 8/08* (2013.01); *C03C 8/24* (2013.01); *H01L 51/5246* (2013.01); *H01L 51/5259* (2013.01); *C03C 2205/00* (2013.01); *H01L 51/56* (2013.01)

(56) References Cited

U.S. PATENT DOCUMENTS

| | | |
|---|---|---|
| 7,090,787 B2 | 8/2006 | Malone et al. |
| 2003/0143423 A1 | 7/2003 | McCormick et al. |
| 2005/0269926 A1 | 12/2005 | Fukuoka et al. |
| 2007/0135552 A1* | 6/2007 | Wrosch .................. B82Y 30/00 524/443 |
| 2008/0309226 A1 | 12/2008 | Kim et al. |
| 2010/0136239 A1 | 6/2010 | Wang et al. |

FOREIGN PATENT DOCUMENTS

| | | |
|---|---|---|
| CN | 1913133 A | 2/2007 |
| CN | 1996638 A | 7/2007 |
| CN | 100438122 C | 11/2008 |
| TW | 200619320 A | 6/2006 |

OTHER PUBLICATIONS

Written Opinion of the International Searching Authority Appln. No. PCT/CN2014/088788; Dated Apr. 9, 2015.

First Chinese Office Action dated Jun. 29, 2016; Appln. No. 201410334114.X.

Second Chinese Office Action dated Sep. 2, 2016; Appln. No. 201410334114.X.

\* cited by examiner

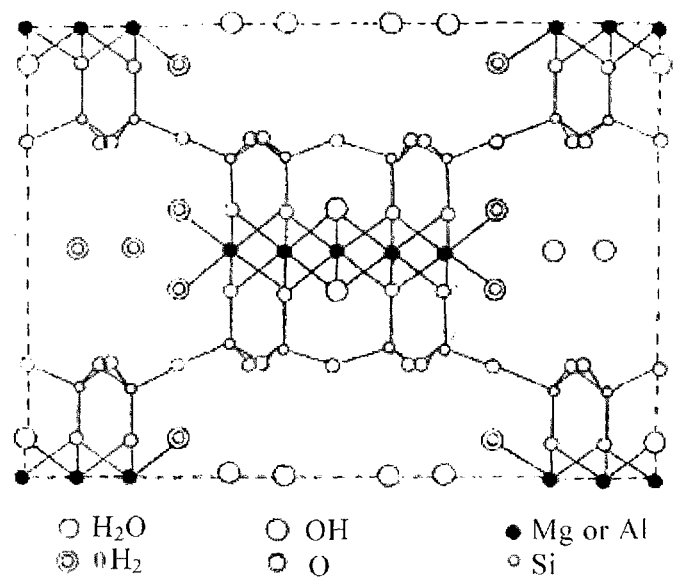

COMPOSITION FOR PACKAGING ELECTRONIC DEVICE, PACKAGING METHOD, AND OLED DISPLAY APPARATUS

TECHNICAL FIELD

At least one embodiment of the present invention relates to a composition for packaging an electronic device, a packaging method, and an OLED display apparatus.

BACKGROUND

OLED (Organic Light-Emitting Diode) display devices are a new type of leading display technique. Both organic materials used during the preparation thereof and active metal materials used to form metal cathodes are sensitive to the water vapor and oxygen gas in air. OLED display device may be deteriorated by the reaction of the penetrated water and oxygen molecules with the organic materials and active metal materials, and consequently influencing the display quality of the OELD display apparatus. Therefore OLED display devices are required to be packaged.

SUMMARY

At least one embodiment of the present invention provides a composition for packaging an electronic device, a packaging method, and an OLED display apparatus. The composition for packaging the electronic device can effectively prevents water and oxygen from entering the electronic device, and especially can effectively reduce the influence of water vapor (moisture) on the electronic device, therefore the lifetime of the packaged electronic device can be effectively extended.

At least one embodiment of the present invention provides a composition for packaging an electronic device, the composition comprising a matrix and an adsorption material having a water vapor adsorption capability, and the adsorption material comprising attapulgite and/or zeolite.

At least one embodiment of the present invention provides an OLED display apparatus, which comprises a packaging substrate and a base substrate on which the OLED display device is arranged, the packaging substrate and the base substrate being bonded and sealed by the above-mentioned composition for packaging an electronic device.

At least one embodiment of the present invention provides a method for packaging an electronic device, which comprises packaging the electronic device with a composition for packaging an electronic device, wherein the composition comprises an adsorption material having a water vapor adsorption capability, the adsorption material comprises attapulgite and/or zeolite.

BRIEF DESCRIPTION OF THE DRAWINGS

In order to illustrate the technical solutions of the embodiments of the present invention more clearly, the figure of the embodiments is described below. Apparently, the figure described below merely relates to some embodiments of the present invention rather than are limitative of the present invention.

FIG. 1 is the structural formula of the attapulgite in Example 1 of the present invention.

DETAILED DESCRIPTION

To make the object, technical solutions, and advantages of the present invention clearer, the technical solutions of the embodiments of the present invention will be described below in a clearer and more complete way with reference to the figure of the embodiments of the present invention. Apparently, the embodiments described are only part, rather than all of the embodiments of the present invention. Based on the embodiments of the present invention described, all the other embodiments obtained by a person of ordinary skills in the art without inventive work fall into the scope of protection of the present invention.

Organic material is commonly used for packaging an electronic device, that is, a macromolecular organic material is coated around the electronic device to be packaged and then the electronic device is pressed and cured to seal the electronic device into the space formed by the top and bottom surfaces of the electronic device and the sides formed by the organic material. After being UV-irradiated or heated, the conventional organic material is epoxy resin which can play a certain role of blocking water and oxygen and protecting the electronic device to some extent. However, the inventor of the present application has noted that epoxy resin is a macromolecular organic material and thus cannot fully block the penetration of small molecules such as water and oxygen.

Currently, some commercially available electronic devices have been packaged with frits. The main components of the frits are glass powders or a mixture of glass powders and ceramic powders. As determined, those electronic devices packaged with frits have a WVTR (Water Vapor Transmission Rate) in the range of $10^{-5}$ g/m$^2$/day to $10^{-6}$ g/m$^2$/day. These WVTR values can substantively fulfill the packaging requirements in the field of consumption electronic products. However, the inventor of the present application has noted that the existing frit packaging cannot fulfill the requirements of the products which are used in more severe environments or require a longer service life.

Therefore, At least one embodiment of the present invention provides a composition for packaging an electronic device, a packaging method, and an OLED display apparatus. In an embodiment of the present invention, the lifetime of the packaged electronic device can be effectively extended by modifying the composition of a frit with attapulgite and/or zeolite which have an adsorption capability. Attapulgite and/or zeolite have relatively strong water and oxygen adsorption capability, thus the frits containing attapulgite and/or zeolite can absorb small molecules such as water and oxygen when those molecules are penetrating to prevent water and oxygen from entering the electronic device, thereby effectively reducing the influence of water vapor on the electronic device. The composition for packaging the electronic device provided in this embodiment of the present invention is particularly suitable for packaging those OLED display devices which have higher demands on water and oxygen blocking capabilities.

To make the technical solutions of the present invention to be better understood by a person skilled in the art, hereinafter, the composition for packaging the electronic device, the packaging method and the OLED display apparatus of the present invention will be further described in detail in combination with the figure and the detailed embodiments.

Example 1

This example provides a composition for packaging an electronic device, and a method for packaging an electronic device and an OLED display apparatus with the composition for packaging the electronic device.

The composition for packaging the electronic device provided by this example comprises a matrix and an adsorption material having a water vapor adsorption capability, and the adsorption material comprises attapulgite and zeolite.

Attapulgite is a crystalline hydrated MgAl silicate mineral and has a laminated chain structural feature. A crystal lattice replacement exists in the structure of attapulgite, and the crystals contain an uncertain amount of $Na^+$, $Ca^{2+}$, $Fe^{3+}$, $Al^{3+}$ and take forms of needles, fibers or fiber aggregates. Attapulgite has a unique adsorption capability, a large specific surface area (the term specific surface area means the total surface area per one mass unit of a material) of 9.6 to 36 $m^2/g$. Attapulgite also has a certain plasticity and cohesive force, such as it has a strong water absorption; has viscosity and plasticity when wetted; and has small shrinkage after dried. Attapulgite has a typical molecular formula of $(MgCaFe)_5Si_8O_{20}(OH)_2(OH_2)_4 \cdot 4H_2O$, and has a theoretic chemical composition: 56.96% $SiO_2$; 23.83% (MgCa)O; and 19.21% $H_2O$. The molecular formula of the structure of attapulgite is as shown in FIG. 1, and the attapulgite has a structure between a chain structure and a laminated structure.

The main component of attapulgite is $SiO_2$, which is the same as the main component of packaging substrates conventionally made by glass materials, thus attapulgite has an expansion coefficient substantially the same as that of the packaging substrates. Moreover, the packaging film can be formed by the sintering process (i.e., a process of melting the processed object at high temperature and then cooling it to form a particular shape or pattern) during packaging, and the composition for packaging the electronic device is heated to melt it by a laser heating method. In this way, a lesser stress can be generated on the composition for packaging the electronic device, which is beneficial to obtain a higher yield (qualified rate) of the electronic device products.

Zeolite is an ore and comprises many types which have a common feature of shelf-shaped structure. That is, within the crystal, molecules are connected together like building shelves and many cavities are formed therein. Water molecules commonly exist in these cavities and will be discharged at high temperature, which, however, does not destroy the crystal structure within the zeolite, and thus the zeolite can absorb water of other liquids once again. Zeolite has a general molecular formula of $A[(AlO_2)xSiO_2)y] \cdot nH_2O$, wherein, A is $K^+$, $Ca^+$, $Na^+$ or $Ba^+$; y/x is in the value range of 1-5; n is the number of water molecules and is a positive integer of not larger than 4.

In a composition of an electronic device provided by at least one case in this example, the molar percent content of the attapulgite is 5 to 15%, and that of the zeolite is 4 to 10%. By using attapulgite and zeolite at the above-mentioned molar percent contents, the composition can, on one hand, have a better viscosity and ensure that inorganic materials are dispersed in organic materials uniformly and an ideal surface appearance can be achieved during the following sintering process; on the other hand, can make a balance between subsequent absorbing water which comes from outside and ensuring the stability upon the increase of temperature during laser heating.

In at least one case, the matrix of the composition for packaging the electronic device may comprise $V_2O_5$, $P_2O_5$ or $TeO_2$. In at least one case, the molar percent content of $V_2O_5$ is 45-52%, the molar percent content of $P_2O_5$ is 20-32%, and the molar percent content of $TeO_2$ is 5-9%. Typically, the total molar percent content of the matrix materials is 70-85%. As trace components, the matrix may further comprise at least one of $Al_2O_3$, SnO, $SnO_2$, $SiO_2$, $WO_3$, ZrO, TiO, CuO, $MoO_3$ ceramic material and any combination thereof. In at least one case, the total molar percent content of the at least one of $Al_2O_3$, SnO, $SnO_2$, $SiO_2$, $WO_3$, ZrO, TiO, CuO, $MoO_3$, ceramic material, and any combination thereof is 2-4%. The above matrix can effectively reduce the expansion coefficient effectively, and also can effectively absorb laser heat to increase the temperature of the composition for packaging the electronic device.

Correspondingly, this example further provides a method for packaging an electronic device. The method is packaging the electronic device with a composition for packaging an electronic device, the composition comprising a matrix and an adsorption material having a water vapor adsorption capability, and the adsorption material comprising attapulgite and zeolite.

In a case, the packaging method comprises the following steps S1)-S5) which will be described in detail hereinafter.

Step S1): formulating attapulgite, zeolite, a matrix and a solvent to form a viscous paste.

In this step, in a case, the attapulgite and the zeolite added to the paste have the following particle size range: $D_{10}$: 0.8±μm; $D_{50}$: 1.6±0.5 μm; $D_{90}$: 3.3±1 μm or $D_{max}$: 8.0±1 μm. For example, "$D_{10}$: 0.8±0.2 μm" means the content of the attapulgite and the zeolite with a particle size range of 0.8±0.2 μm is 10% of the solid content (the term "solid content" means after a matter containing liquid materials has been dried at a certain condition, the mass percent of the remaining matter to the whole matter); that is, 10% of the attapulgite and zeolite can pass through the filter sieve. By reducing the particle size of the attapulgite so that it can match with the size of other materials in the composition for packaging the electronic device as good as possible, a better processing performance can be obtained in the following packaging process.

In at least one case, the matrix comprises at least one of $V_2O_5$, $P_2O_5$, $TeO_2$ materials, and any combination thereof. In at least one case, the solvent comprises ethyl cellulose, methyl cellulose, nitrocellulose, hydroxymethyl cellulose, acrylate, methacrylate or epoxy resin. The solvent is favorable for dispersing solid particles and preventing the solid particles from agglomeration and distributing the solid particles in the solvent uniformly. In at least one case, the powders of the above matrix, attapulgite and zeolite are formulated with a solvent according to a certain ratio to form the paste. The paste may have a viscosity range of 20-160 Pa·s.

Step S2): coating the paste on a edge region of a packaging substrate to produce a packaging pattern.

In this step, such as, the paste can be coated on the edge region of the packaging substrate and the packaging pattern can be formed by using screen printing technique.

Step S3): drying the packaging substrate from Step S2) to remove the organic matter from the paste, to obtain the remaining inorganic matter.

In this step, the organic matter in this example are mainly solvents for dispersing the inorganic matter, and comprise grease, hydrocarbon and alcohol. The inorganic matter mainly comprises metals and oxides thereof, such as $V_2O_5$, $TeO_2$ or $Al_2O_3$, etc., ceramic materials, attapulgite and zeolite, etc. Typically, the paste is dried at a high temperature higher than 400° C., such as, the temperature at which the packaging substrate coated with the paste is high-temperature dried is in the range of 400 to 500° C. The drying duration is in the range of 20-40 min. In the course of the high temperature drying, water which is contained in the attapulgite and zeolite has been evaporated off such that the formed packaging film has a favorable water absorption effect during the use of the electronic device and thus has a water resistance. Herein, if the water molecules which are contained in the composition for packaging the electronic device itself have not been removed, the attapulgite and zeolite in the composition for packaging the electronic device remain steady structures after the packaging frame is formed and will not absorb extra water, thus the water absorption effect cannot be achieved. In this example, the water in the composition for packaging the electronic device are removed by high temperature drying, thus water may not influence the water and oxygen resistances of the composition for packaging.

Step S4): assembling the packaging substrate with a base substrate provided with the electronic device.

Before this step, the electronic device has been formed on the base substrate. In this step, the packaging substrate on which the inorganic matter is formed after the high temperature drying is assembled with the base substrate to completely enwrap the electronic device within the packaging pattern formed on the packaging substrate, and signal lines and metal lines for power supply is lead out.

Step S5): sintering the inorganic matter to form a packaging film which bonds and seals the packaging substrate and the base substrate, thereby accomplishing the packaging of the OLED display device.

The composition for packaging the electronic device in this example is a low melting point frit system which has a melting temperature of 430 to 450° C. and into which a total molar percent content of 9 to 25% of attapulgite and zeolite are added. In this step, in a case, the inorganic matter is molten by laser heating, such as semiconductor laser heating, and then cooled and cured to finish the sintering. For example, the laser may have a power of 5 to 40 w and a speed of 5 to 30 mm/s. In at least one case, the packaging film formed by the inorganic matter has a thickness of 4 to 10 μm.

In order to determine the packaging effect of the electronic device packaged by the composition for packaging the electronic device, the following tests are made: three samples with different ratios of the main components ($V_2O_5$, $P_2O_5$ or $TeO_2$ materials) of the matrix, attapulgite and zeolite are formulated and labeled as Sample 1 to Sample 3, respectively. The specific compositions of these samples are shown in Table 1.

TABLE 1 the molar percent contents of the main components of the matrix, attapulgite and zeolite

|  | Sample 1 | Sample 2 | Sample 3 |
|---|---|---|---|
| $V_2O_5$ (mol %) | 45.80 | 50.31 | 51.87 |
| $P_2O_5$ (mol %) | 31.40 | 22.62 | 26.30 |
| $TeO_2$ (mol %) | 8.32 | 5.52 | 6.65 |
| attapulgite (mol %) | 7.45 | 12.58 | 5.64 |
| zeolite (mol %) | 4.87 | 6.04 | 8.07 |

The packaging process of the composition for packaging the electronic device is illustrated by the formulation of Sample 2.

Step S1)-Step S3): A paste, also referred to as a frit, is formulated with a solvent having ethyl cellulose as the main component, and the paste has a viscosity of 30 Pa·s. A packaging film layer having a thickness of 17 μm are obtained on a packaging substrate by using screen printing to form a packaging pattern which is also in the shape of the packaging film. The packaging substrate is dried in the condition of 450° C. for 20 min. The fit formed with the formulation of Sample 2 is compared with a fit without attapulgite and zeolite. It can be seen from the obtained micrographs that the dried frit with attapulgite and zeolite has a finer quality and is more suitable for mass production.

The lifetime of the packaged electronic device will be extended by increasing the content of the attapulgite and zeolite. However, when the content has been increased to a certain value, the melting effect of laser on the composition for packaging the electronic device will be affected, thereby influencing the sintering effect of the packaged film. Therefore, in at least one case, the total molar percent content of both attapulgite and zeolite may be controlled to 11-20%.

In the composition for packaging the electronic device of this example, the dried fit comprises only inorganic matter, thus the frit can melt under laser heating during sintering, thereby achieve the bonding and sealing between the packaging substrate and the base substrate provided with the electronic device and achieve the packaging of the OLED display device.

Step S4)-Step S5): The composition for packaging the electronic device is used for packaging the electronic device. The packaging substrate is assembled with the base substrate. The frit is irradiated by a laser which is set to the power of 10 w and the speed of 20 mm/s to melt the inorganic matter, and then are cooled and cured to finish the sintering. After sintering, the packaging substrate and the base substrate are bonded and sealed to form a packaging film and achieve the packaging of the electronic device. The electronic device formed by the above-mentioned packaging method using this composition for packaging an electronic device, as determined, has a WVTR (Water Vapor Transmission Rate) of about 1/1000 times that of the similar structure packaged with the material having no attapulgite and zeolite, thus the blocking effect for water and oxygen has been improved substantially.

This example also provides an OLED display apparatus which comprises a packaging substrate and a base substrate provided with the OLED display device. The packaging substrate and the base substrate are bonded and sealed by using the composition for packaging the electronic device of this example to achieve the packaging of the OLED display device. It is discovered by tests that the packaging film of the OLED display device formed by the fit made from the formulation of Sample 2 has a better blocking effect against water vapor and an OLED display apparatus product having a stable seal effect is obtained.

Meanwhile, parallel aging tests have been made for the OLED display device. The test conditions are shown in Table 2.

TABLE 2

Aging test conditions and test results for different samples

|  | Aging addition |  | Test result |
|---|---|---|---|
| Sample 1 | temperature | 85° C. | Minor black spots occur. |
|  | Relative moisture | 85% | The brightness attenuation of the |
|  | Time (h) | 240 | OLED display device is 18%. |
| Sample 2 | The same as Sample 1 |  | None black spot occurs. The brightness attenuation of the OLED display device is 3%. |

Sample 1 uses common frit existing in the present technical field; and Sample 2 uses Sample 2 in Table 1 and is a fit having attapulgite and zeolite added. It can be seen from the test results that after the aging test, the present OLED display device produced by the fit having attapulgite and zeolite added has a performance superior to that of the OLED display device produced by the material having no attapulgite or zeolite, thus an OLED display apparatus which uses the present OLED display device has a better display quality.

In practical applications, the molar percent of attapulgite and zeolite can be determined flexibly according to the applied environment of the OLED display device to be packaged to achieve optimal blocking effect against water vapor and oxygen gas and ensure the laser melting effect and sintering effect of the composition for packaging the electronic device.

For the OLED display device, a packaging film is formed by a frit with attapulgite and zeolite and blocks water vapor and oxygen gas in air, especially effectively blocks water vapor. Thus, packaging the OLED display device with this composition for encapsulating the electronic device can effectively block water vapor and oxygen gas to penetrate into the OLED display device from outside and extend the lifetime of the OLED display device, thereby extending the lifetime of the OLED display apparatus. Moreover, the packaging of the OLED display device as stated above can be achieved merely by using packaging device commonly used by a person skilled in the art, and no extra production cost is added.

Example 2

This example provides a composition for packaging an electronic device comprising a matrix and an adsorption material having a water vapor adsorption capability. The adsorption material comprises attapulgite.

In comparison with Example 1, the composition for packaging the electronic device in this example does not comprise zeolite. All components of the matrix and the component of attapulgite can be determined with reference to the corresponding components and amount thereof in Example 1 and are not described again herein. Correspondingly, the method used in this example for packaging the electronic device with the composition for packaging the electronic device is the same as that in Example 1 and is also not described again herein.

This example further provides an OLED display apparatus. The OLED display device of the OLED display apparatus is packaged with the composition for packaging the electronic device of this example by a corresponding electronic device packaging method.

In practical applications, the molar percent content of attapulgite can be determined flexibly according to the applied environment of the OLED display device to be packaged to achieve optimal blocking effect against water vapor and oxygen gas.

The OLED display device uses a packaging film formed by a fit with attapulgite to block water vapor and oxygen gas in air, especially to effectively block water vapor. Thus, packaging the OLED display device with this composition for packaging an electronic device can effectively block the penetration of water vapor and oxygen gas into the OLED display device from outside and extend the lifetime of the OLED display device.

Example 3

This example provides a composition for packaging an electronic device comprising a matrix and an adsorption material having a water vapor adsorption capability. The adsorption material comprises zeolite.

In comparison with Example 1, the composition for packaging the electronic device in this example does not comprise attapulgite. All components of the matrix and the component of zeolite can be determined with reference to the corresponding components and amount thereof in Example 1 and are not described again herein. Correspondingly, the method used in this example for packaging the electronic device with the composition for packaging the electronic device is the same as that in Example 1 and is also not described again herein.

This example further provides an OLED display apparatus. The packaging substrate and the base substrate of the OLED display apparatus are bonded and sealed by using the composition for packaging the electronic device of this example and are packaged by the corresponding electronic device packaging method.

In practical applications, the molar percent of zeolite can be determined flexibly according to the applied environment of the OLED display device to be packaged to achieve optimal blocking effect against water vapor and oxygen gas.

The OLED display device uses a packaging film formed by a fit with zeolite to block water vapor and oxygen gas in air, especially to effectively block water vapor. Thus, packaging the OLED display device with this composition for packaging an electronic device can effectively block the penetration of water vapor and oxygen gas into the OLED display device from outside and extend the lifetime of the OLED display device.

The attapulgite and/or zeolite have stronger absorption capability for water and oxygen, and the fit containing attapulgite and/or zeolite can absorb penetrating small molecules such as water and oxygen and prevent water and oxygen from entering the electronic device. By adding attapulgite and/or zeolite which have an adsorption effect to modify the formulation of the fit, the compositions for packaging an electronic device provided in Examples 1-3 can effectively reduce the influence of water vapor on the electronic device, thereby effectively extending the lifetime of the packaged electronic device. The compositions for packaging an electronic device provided in the above examples are particularly suitable for packaging those OLED display devices which have higher demands on water and oxygen blocking capabilities to obtain OLED display apparatus with better display effects.

It can be understood that the above embodiments are merely exemplary embodiments which is used for illustrate the principle of the present invention, and the present invention, however, are not intended to be limited thereto. Various changes and modifications can be made herein for a person skilled in the art without departing from the spirit and essence of the present invention, and those changes and modifications are considered within the scope of protection of the present invention.

The present application claims the priority of the Chinese Patent Application No. 201410334114.X submitted on Jul. 14, 2014, and the content disclosed in the above Chinese patent application is incorporated by reference as part of this application.

What is claimed is:
1. A composition for packaging an electronic device, comprising an inorganic matrix and an adsorption material having a water vapor adsorption capability, wherein, the adsorption material comprises attapulgite and/or zeolite.

2. The composition for packaging the electronic device according to claim 1, wherein, the attapulgite has a molecular formula of $$(MgCaFe)_5Si_8O_{20}(OH)_2(OH_2)_4 \cdot 4H_2O.$$

3. The composition for packaging the electronic device according to claim 1, wherein, the zeolite has a general molecular formula of $$A[(AlO_2)_x(SiO_2)y] \cdot nH_2O,$$

wherein, A is $K^+$, $Ca^+$, $Na^+$ or $Ba^+$; y/x is a value of 1-5; n is a number of water molecules and is a positive integer not larger than 4.

4. The composition for packaging the electronic device according to claim 1, wherein, a molar percent content of the attapulgite is 5 to 15%, and/or that of the zeolite is 4 to 10%.

5. The composition for packaging the electronic device according to claim 1, wherein, a total molar percent content of the attapulgite and the zeolite is 11-20%.

6. The composition for packaging the electronic device according to claim 1, wherein, the inorganic matrix comprises at least one of $V_2O_5$, $P_2O_5$, $TeO_2$ and any combination thereof.

7. The composition for packaging the electronic device according to claim 6, wherein, a molar percent content of $V_2O_5$ is 45-52%, a molar percent content of $P_2O_5$ is 20-32%, and a molar percent content of $TeO_2$ is 5-9%.

8. The composition for packaging the electronic device according to claim 6, wherein, the inorganic matrix further comprises at least one selected from a group consisting of $Al_2O_3$, $SnO$, $SnO_2$, $SiO_2$, $WO_3$, $ZrO$, $TiO$, $CuO$, $MoO_3$, and ceramic material.

9. The composition for packaging the electronic device according to claim 8, wherein, a total molar percent content of the at least one selected from a group consisting of $Al_2O_3$, $SnO$, $SnO_2$, $SiO_2$, $WO_3$, $ZrO$, $TiO$, $CuO$, $MoO_3$, and ceramic material is 2-4%.

10. An OLED display apparatus, comprising a packaging substrate and a base substrate, wherein, the base substrate is provided with an OLED display device thereon, the packaging substrate and the base substrate are bonded and sealed by the composition for packaging the electronic device according to claim 1.

11. A method for packaging an electronic device, comprising packaging the electronic device with a composition for packaging the electronic device comprising an inorganic matrix and an adsorption material having a water vapor adsorption capability, wherein, the adsorption material comprises attapulgite and/or zeolite.

12. The method for packaging the electronic device according to claim 11, comprising the following steps:
S1): formulating attapulgite and/or zeolite, the inorganic matrix and a solvent to form a viscous paste, the solvent being organic matter, the inorganic matrix and attapulgite and/or zeolite being inorganic matter;
S2): coating the paste on an edge region of a packaging substrate to generate a packaging pattern;
S3): drying the packaging substrate from S2) to remove the organic matter from the paste to obtain the remaining inorganic matter;
S4): assembling the packaging substrate from S3) with the base substrate provided with the electronic device; and
S5): sintering the inorganic matter to form a packaging film which bonds and seals the packaging substrate and the base substrate.

13. The method for packaging the electronic device according to claim 12, wherein, in S1), the attapulgite and/or zeolite have the following particle size: $D_{10}$: 0.8±0.2 μm; $D_{50}$: 1.6±0.5 μm; $D_{90}$: 3.3±1 μm or $D_{max}$: 8.0±1 μm.

14. The method for packaging the electronic device according to claim 12, wherein, the inorganic matrix comprises at least one of $V_2O_5$, $P_2O_5$, $TeO_2$ and any combination thereof.

15. The method for packaging the electronic device according to claim 12, wherein, the solvent comprises ethyl cellulose, methyl cellulose, nitrocellulose, hydroxymethyl cellulose, acrylate, methacrylate or epoxy resin.

16. The method for packaging the electronic device according to claim 12, wherein, the paste has a viscosity of 20-160 Pa·s.

17. The method for packaging the electronic device according to claim 12, wherein, in S3), the packaging substrate is dried at a temperature in a range of 400 to 500° C. for 20-40 min.

18. The method for packaging the electronic device according to claim 12, wherein, in S5), the inorganic matter is molten by laser heating, and then cooled and cured to finish the sintering.

19. The method for packaging the electronic device according to claim 18, wherein, the laser has a power of 5 to 40 W and a speed of 5 to 30 mm/s.

20. The method for packaging the electronic device according to claim 12, wherein, the packaging film formed by the inorganic matter has a thickness of 4 to 10 μm.

* * * * *